United States Patent [19]

Ishikawa et al.

[11] Patent Number: 4,987,096

[45] Date of Patent: Jan. 22, 1991

[54] MANUFACTURING METHOD OF SEMICONDUCTOR LASER WITH NON-ABSORBING MIRROR STRUCTURE

[75] Inventors: Masayuki Ishikawa, Nishimine; Hajime Okuda; Hideo Shiozawa, both of Yokohama; Kazuhiko Itaya, Tokyo; Yukio Watanabe, Yokohama; Mariko Suzuki, Yokohama; Genichi Hatakoshi, Yokohama, all of Japan

[73] Assignee: Kabushiki Kaisha Toshiba, Kawasaki, Japan

[21] Appl. No.: 450,063

[22] Filed: Dec. 13, 1989

[30] Foreign Application Priority Data

Dec. 14, 1988 [JP] Japan .................................. 63-315618

[51] Int. Cl.⁵ ............................................ H01L 21/20
[52] U.S. Cl. ............................ 437/129; 148/DIG. 95; 148/DIG. 25; 437/112; 437/133
[58] Field of Search .................... 148/DIG. 22, 25, 26, 148/50, 56, 65, 72, 95, 110, 97, 119, 160, 155, 169, 33, 38.1, 33.4; 357/16, 17; 372/43, 45, 46, 48, 50; 437/81, 89, 90, 95, 96, 105, 107, 108, 110, 126, 129, 112, 133, 926, 936, 939, 946, 949, 970, 976

[56] References Cited

U.S. PATENT DOCUMENTS

| | | | |
|---|---|---|---|
| 4,340,966 | 7/1982 | Akiba et al. ............................. | 372/45 |
| 4,355,396 | 10/1982 | Hawrylo et al. ...................... | 437/129 |
| 4,480,331 | 10/1984 | Thompson ............................. | 372/45 |
| 4,788,689 | 11/1988 | Tokuda et al. ........................ | 372/45 |
| 4,792,958 | 12/1988 | Ohba et al. ............................. | 372/45 |
| 4,799,228 | 1/1989 | Nagasaka et al. ..................... | 372/46 |
| 4,809,287 | 2/1989 | Ohba et al. ............................. | 372/45 |
| 4,821,278 | 4/1989 | Yang et al. ............................. | 372/45 |
| 4,835,117 | 5/1989 | Ohba et al. ............................. | 437/129 |
| 4,893,313 | 1/1990 | Hatakoshi et al. ..................... | 372/46 |
| 4,910,743 | 3/1990 | Ohba et al. ............................. | 372/45 |
| 4,922,499 | 5/1990 | Nitta et al. ............................. | 372/46 |
| 4,941,146 | 7/1990 | Kobayashi ............................. | 372/45 |

FOREIGN PATENT DOCUMENTS

| | | | |
|---|---|---|---|
| 0135994 | 10/1981 | Japan .................................... | 372/45 |
| 2097389 | 5/1987 | Japan .................................... | 372/45 |

OTHER PUBLICATIONS

Japanese Journal of Applied Physics, vol. 24, No. 8, "AlGaAs Window Stripe Buried Multiquantum Well Lasers", Nakashima et al, pp. L647-L649, Aug., 1985.
IEEE Journal of Quantum Electronics, vol. QE-15, No. 8, "An AlGaAs Window Structure Laser", Yonezu et al, pp. 775-781, Aug. 1979.

*Primary Examiner*—Olik Chaudhuri
*Assistant Examiner*—William D. Bunch
*Attorney, Agent, or Firm*—Oblon, Spivak, McClelland, Maier & Neustadt

[57] ABSTRACT

An InGaAlP NAM structure laser is formed with a double-heterostructure section disposed on an n-type GaAs substrate. The double-heterostructure section includes a first cladding layer of n-type InGaAlP, a non-doped InGaP active layer, and a second cladding layer of p-type InGaAlP. An n-type GaAs current-blocking layer having a stripe opening and a p-type GaAs contact layer are sequentially formed on the second cladding layer by MOCVD crystal growth. A low-energy band gap region is defined in a central region of the active layer located immediately below the stripe opening. A high-energy band gap region is defined in a peripheral region of the active layer corresponding to a light output end portion of the laser and located immediately below the current-blocking layer. Therefore, self absorption of an oscillated laser beam at the output end portion can be reduced or prevented.

13 Claims, 7 Drawing Sheets

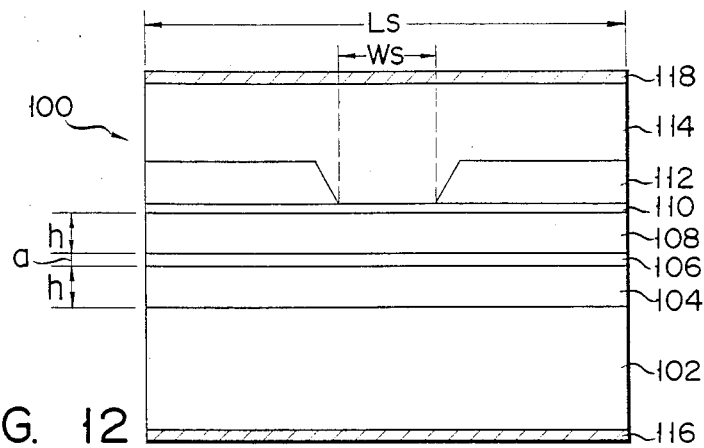
F I G. 12
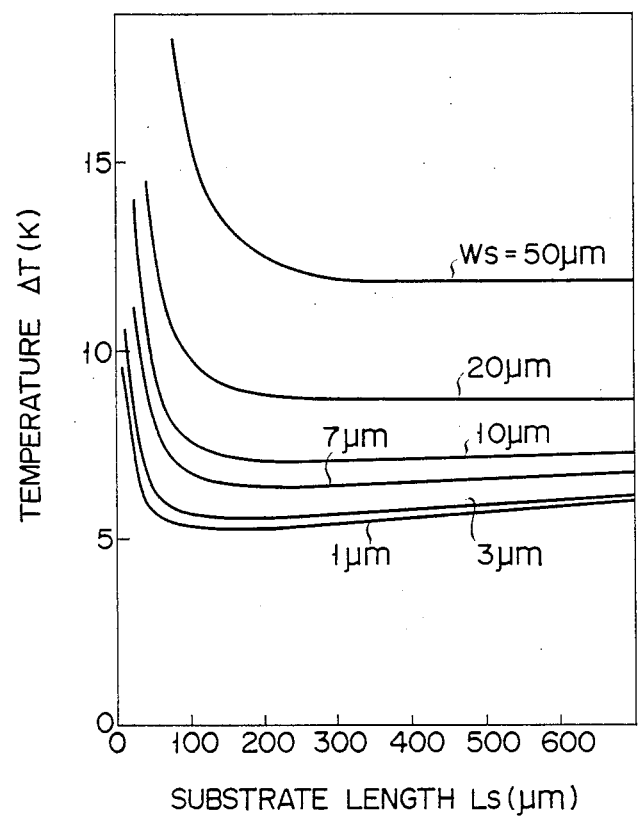
F I G. 13

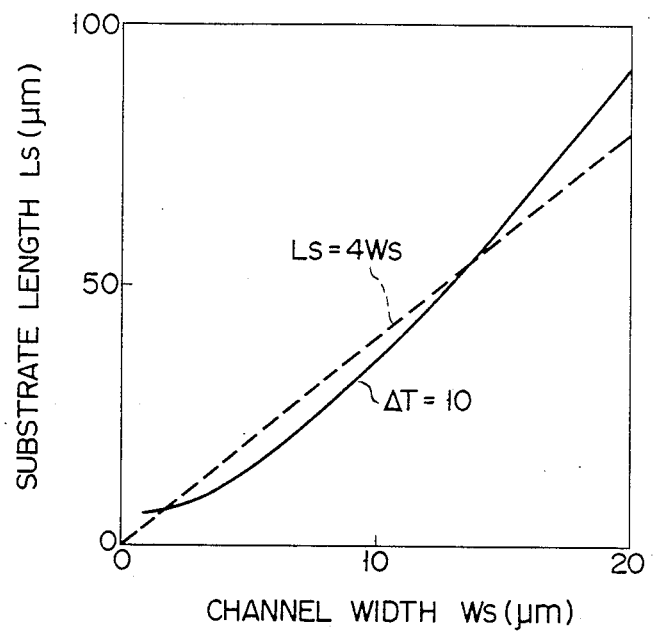
F I G. 14

MANUFACTURING METHOD OF SEMICONDUCTOR LASER WITH NON-ABSORBING MIRROR STRUCTURE

BACKGROUND OF THE INVENTION

1. Field of the Invention

The present invention relates to semiconductor laser devices using a compound semiconductor material and, more particularly, to a method of manufacturing semiconductor laser devices for stably providing a laser oscillation of visible light at room temperature.

2. Description of the Related Art

Rapid advances in semiconductor technologies have led to a variety of applications for semiconductor devices serving as solid-state light-emitting elements. Unceasing efforts have been made to satisfy needs for higher outputs and higher reliability. In recent years, indium/gallium/aluminum/phosphorus (to be referred to as "InGaAlP" hereinafter)-based semiconductor materials have received a great deal of attention as materials for semiconductor lasers which provide visible light oscillation. This is because the compound semiconductor materials have largest band gaps among Group III–V compound semiconductor mixed crystals except for nitrides.

In particular, a semiconductor laser with a double-heterostructure having active and cladding layer of InGaAlP on a gallium arsenide (to be referred to as "GaAs" hereinafter) substrate can exhibit a stable laser oscillation of visible light in a 0.6-micrometer band at room temperature. A semiconductor laser of this type is expected to be used in various applications which cannot be realized using conventional infrared-range semiconductor lasers. Therefore, a semiconductor laser of this type is a very expecting light-emitting device.

Presently available semiconductor laser devices having an InGaAlP double-heterostructure, however, suffer from the following disadvantages: (1) a light output cannot be increased up to a desired value; and (2) it is difficult to keep satisfactory operation reliability in a maximum light output oscillation mode.

According to the studies by the present inventors, it was confirmed that the above problems were mainly caused by undesired self light absorption at a light output end of an InGaAlP active layer in a laser oscillation mode, as will be explained hereinafter in more detail.

In general, a stripe light guide structure is applied to an InGaAlP semiconductor laser. A GaAs current-blocking layer is formed on a double-heterostructure in which an InGaAlP active layer is sandwiched by upper and lower cladding layers, and the current-blocking layer is provided with an elongated groove, i.e., a stripe opening. A GaAs ohmic contact layer covers the channel and the current-blocking layer. In an oscillation mode, oscillated laser beams are confined in only the opening, and hence this opening serves as a light waveguide channel. An oscillation wavelength is determined depending on a band gap energy of the InGaAlP layer serving as a light-emitting region of the active layer. An InGaAlP active layer is conventionally formed using an epitaxial growth method which is popular among persons skilled in the art. Therefore, a band gap energy is simply constant across the entire active layer.

With such an arrangement, when supply of a maximum injection current is continued in order to successively perform an oscillation at a maximum light output level of the semiconductor laser at room temperature, the light output is abruptly decreased, and operation stability is damaged. Such degradation in performance is also observed in semiconductor lasers of other types such as a transverse mode stabilized InGaAlP laser. Therefore, the above-mentioned degradation in performance is an inherent phenomenon of InGaAlP compound semiconductor materials, and can be considered to be caused by its limited inherent allowable light density. In practice, substrates of several elements degraded due to laser oscillation were removed, and a current injection light-emitting pattern was observed from the substrate side. It was confirmed that a black portion was formed near each light output end of the laser element. This observation result demonstrates generation of the following vicious circle. That is, a light density of the laser beam output end of the InGaAlP active layer is increased beyond an inherent allowable limit of the material, self light absorption is accelerated, heat is generated, and the heat generation causes further acceleration of self light absorption. Such a vicious circle of self light absorption adversely affects, i.e., not only decreases a laser oscillation efficiency, but also physically breaks down a light output layer in the active layer, since it causes a damage, melting, and degradation of the layer quality of the layers near the laser oscillation output end in the active layer.

These problems have spoiled usefulness and future applications of InGaAlP semiconductor laser devices and are decisive for semiconductor manufacturers. Applications of InGaAlP laser devices without drastic resolutions for the above problems seem impossible.

In order to prevent degradation in performance associated with the above-mentioned self light absorption, several high-output semiconductor laser devices each having a "non-absorbing mirror" structure have been proposed. For example, a self-absorption prevention technique is disclosed in "An AlGaAs Window Structure Laser", HIRO O. YONEZU et al, IEEE Journal of Quantum Electronics, Vol. QE-15, No. 8, August, 1979 at pp. 775–781, wherein impurity such as Zn is doped into an active layer in such a manner that the both end portions thereof are kept undoped, so that the band gap energy at the both end portion of the active layer is higher than that of the remaining portions thereof. Another technique is disclosed in "AlGaAs Window Stripe Buried Multiquantum Well Lasers", HISAO NAKASHIMA et al, Japanese Journal of Applied Physics, Vol. 24, No. 8, August, 1985, at pp. L647–L649, wherein an impurity such as Zn is diffused in two end portions of the active layer to increase its internal band gap energy in only the diffusion region, thus decreasing self light absorption. According to the technique disclosed in this article, however, a method of manufacturing lasers with a "non-absorbing mirror" structure requires very complicated manufacturing processes involving strict control of crystal growth. Therefore, practical application of these processes cannot be expected for semiconductor manufacturers very much. In addition, application of these techniques to the manufacture of high-power semiconductor lasers using a specific InGaAlP-based semiconductor material, which suffers from more difficult crystal growth manufacture than GaAlAs, can be hardly expected.

SUMMARY OF THE INVENTION

It is therefore an object of the present invention to provide a new and improved a manufacturing method of a high-power semiconductor laser of NAM structure.

In accordance with the above object, the present invention is addressed to a specific semiconductor laser which comprises a first cladding layer formed above a semiconductor substrate, an active layer disposed on the first cladding layer, and a second cladding layer provided on the active layer. The second cladding layer includes a waveguide channel region to which a current is mainly supplied in an oscillation mode of the laser, and an output end from which an oscillated laser beam is externally output. A current-blocking layer is disposed on the second cladding layer, includes an opening defined above a central region of the waveguide channel region, and covers the second cladding layer in only its peripheral portion corresponding to the output end. The active layer includes a high-energy band gap region in a peripheral portion thereof adjacent to the output end of the second cladding layer, and a band gap energy of portions except for the high-energy band gap region is kept low, whereby self absorption of the oscillated laser beam at the output end can be reduced or prevented.

According to the manufacturing method of this invention, in order to form such a high-energy band gap region in the active layer, additional steps such as the step of selectively doping an impurity are not required at all. A contact layer may be formed on the current blocking layer having the opening by a metal organic chemical vapor deposition (MOCVD) method. At this time an impurity is naturally diffused from the second cladding layer located immediately under the current-blocking layer to the active layer, and hence the high-energy band gap region can be defined at only a peripheral portion of the active layer The present invention, and its objects and advantages will become more apparent in the detailed description of preferred embodiments presented below.

BRIEF DESCRIPTION OF THE DRAWINGS

In the detailed description of preferred embodiments of the present invention presented below, reference is made to the accompanying drawings of which:

FIG. 12 is a schematic diagram showing the entire arrangement of a high-output InGaAlP laser with a NAM 7 structure according to still another embodiment of the present invention;

FIG. 13 is a graph showing a measurement result of change characteristics of a temperature increase $\Delta T$ of an active layer as a function of a value Ls in a continuous oscillation mode of the laser shown in FIG. 12; and FIG. 14 is a graph showing correlation characteristics obtained by plotting measurement values of a substrate length Ls as a function of a channel width Ws when a target value of the temperature increase $\Delta T$ of the laser is 10 degrees.

DETAILED DESCRIPTION OF THE PREFERRED EMBODIMENTS

Figure 1:
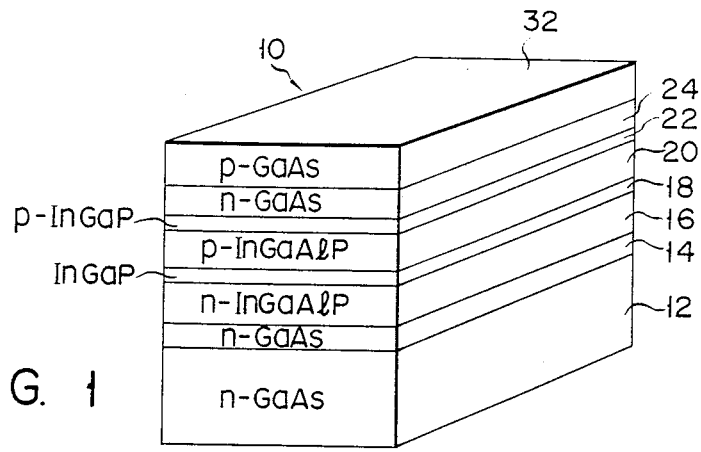
FIG. 1 is a schematic diagram showing the entire arrangement of a high-output InGaAlP laser with a NAM structure according to a preferred embodiment of the present invention.

In FIG. 1, a semiconductor laser according to a preferred embodiment of the present invention is generally designated by reference numeral "10". A semiconductor substrate 12 is a gallium arsenide (GaAs) layer of n-type conductivity. A buffer layer 14 is formed on the n-GaAs substrate 12 by well-known crystal growth. The buffer layer 14 may be a GaAs layer, typically 0.5 micrometers thick and doped with an n-type impurity to a concentration of $8 \times 10^{17}$ atoms per cubic centimeter.

A double-heterostructure section is disposed on a surface of the n-GaAs buffer layer 14. The double-heterostructure section includes a first cladding layer 16, an active layer 18, and a second cladding layer 20. The first cladding layer 16 may be an n-type $In_{0.5}Ga_{0.15}Al_{0.35}P$ layer having a thickness of approximately 0.8 micrometers, doped with an n-type impurity such as Si to a concentration of $4 \times 10^{17}$ atoms per cubic centimeter. The active layer 18 may be a nondoped $In_{0.5}Ga_{0.5}P$ layer of p-type conductivity, typically 0.06 micrometers thick. In principle, a carrier concentration of the active layer 18 is $1 \times 10^{17}$ per cubic centimeter or less. The active layer 18 may be of an n- or p-type. The second cladding layer 20 may be a p-type $In_{0.5}Ga_{0.15}Al_{0.35}P$ layer having a thickness of approximately 0.8 micrometers, doped with a p-type impurity such as Zn to a concentration of $4 \times 10^{17}$ atoms per cubic centimeter. With such an arrangement, it was confirmed based on X-ray diffraction measurement by the present inventors that the double-heterostructure section was excellently lattice-matched with the n-GaAs substrate 12.

A p-type cap layer 22 is disposed on the second cladding layer 20 to a predetermined thickness, for example, 0.05 micrometers. The cap layer 22 may be an $In_{0.5}Ga_{0.5}P$ layer that is doped with a p-type impurity such as Zn to a concentration of $2 \times 10^{18}$ atoms per cubic centimeter. An n-type current-blocking layer 24 is positioned on the cap layer 22. The current-blocking layer 24 may be a GaAs layer, typically 0.5 micrometers thick and doped with an n-type impurity such as Si to a concentration of $2 \times 10^{18}$ atoms per cubic centimeter.

Figure 2:
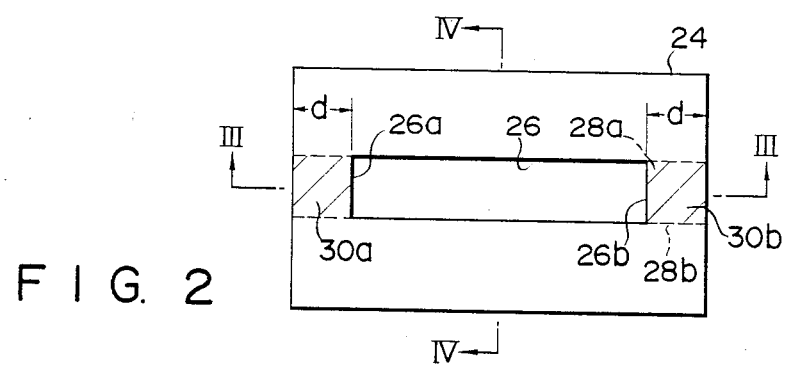
FIG. 2 is a diagram showing a plan view of a current-blocking layer having a stripe opening of the laser shown in FIG. 1.

As shown in FIG. 2, the current-blocking layer 24 has a rectangular elongated opening 26 in its central region. In this description, the opening 26 may often be referred to as a "stripe opening" hereinafter. The top surface of the underlying cap layer 22 is partially exposed through the opening 26. The longitudinal direction of the opening 26 corresponds to a direction of laser oscillation (waveguide direction) of the double-heterostructure semiconductor laser 10. Assume that a waveguide channel section is a region defined between parallel broken lines 28a and 28b, as shown in FIG. 2. Therefore, a region 30a or 30b hatched for the sake of convenience serves as an output end of an oscillated laser beam. As is apparent from FIG. 2, the stripe opening 26 of the current-blocking layer 24 does not reach the light output end region. In this embodiment, the opening 26 is terminated at a position spaced apart inward from the end faces of the regions 30a and 30b of the laser 10 by only approximately 5 micrometers. In other words, each of both ends 26a and 26b of the opening 26 is located to be spaced apart from the corresponding end face of the regions 30a and 30b of the laser 10 by 5 micrometers (or more). This separation distance is designated by "d" in FIG. 2. An ohmic contact layer 32 (see FIG. 1) is formed on the current-blocking layer 24 to bury the opening 26. The ohmic contact layer 32 may be a p-type GaAs layer, approximately 3 micrometers thick and doped with a p-type impurity such as Zn to a concentration of $3 \times 10^{18}$ atoms per cubic centimeter.

Figure 3:
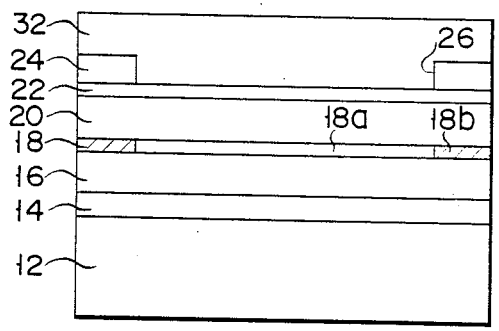
FIG. 3 is a diagram showing a cross-sectional structure taken along the line III—III of the laser shown in FIG. 1.
Figure 4:
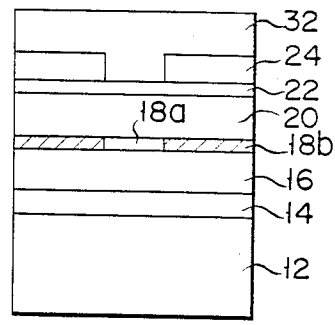
FIG. 4 is a diagram showing a cross-sectional structure taken along the line IV—IV of the laser shown in FIG. 1.

The structure of the cross section of the laser 10 is shown in detail in FIGS. 3 and 4. In the active layer 18, low- and high-energy band gap regions 18a and 18b are defined. The low-energy band gap region 18a is formed in a central region of the active layer 18, and is located immediately below the stripe opening 26 of the above-mentioned current-blocking layer 24. A planar shape of the low-energy band gap region 18a, therefore, corresponds to that of the opening 26. The low-energy band gap region 18a serves as a main light-emitting section. The high-energy band gap region 18b surrounds the low-energy band gap region 18a in the active layer 18. In FIGS. 3 and 4, the region 18b is hatched for the purpose of enhancement of visual distinction. A difference in energy band gap between these regions 18a and 18b in the active layer 18 is caused by a difference in atomic alignment of crystals. Such a difference in band gap energy realizes a non-absorbing mirror (NAM) structure in the laser 10. Therefore, oscillation laser beams generated in the active layer 18 are efficiently confined in the active layer 18, thus minimizing undesirable absorption in the light output end.

It should be noted that the above-mentioned difference in band gap energy between the regions 18a and 18b is required to be at least 20 meV in order to provide an excellent NAM structure in the laser 10. When photoluminescence evaluation was performed for devices which were experimentally manufactured in practice by the present inventors, the band gap energy of the low-energy band gap region 18a was smaller than that of the high-energy band gap region 18b by approximately 20 to 90 meV. When a transmission electron diffraction image of the high-energy band gap region 18b was examined, it was demonstrated that the region 18b in the active layer 18 has a zincblende structure. On the other hand, excessive spots were observed in the transmission electron diffraction image of the low-energy band gap region 18a. This fact apparently proves the presence of the above-mentioned difference in band gap energy.

An oscillation wavelength of the double-heterostructure semiconductor laser 10 with the above arrangement is determined depending on a band gap energy of the low-energy band gap region 18a of the active layer 18 in which electron injection is mainly performed. An absorption coefficient of the high-energy band gap region 18b with respect to the oscillation light beam having the determined wavelength is smaller than that of the low-energy band gap region 18a. Therefore, undesirable self absorption of the oscillation light beam at the low-energy band gap region 18a (i.e., laser beam output end) which causes a reduction in oscillation efficiency of the laser 10 can be suppressed or prevented.

The experiment performed by the present inventors has demonstrated the following results. With the laser structure shown in FIGS. 1 through 4, when semiconductor lasers each having a width of the stripe opening 26 of 7 micrometers, a resonance cavity length of 300 micrometers, and a distance d between each of two ends of the opening 26 and the corresponding laser beam output end of 15 micrometers were subjected to continuous oscillation, each threshold current of the lasers was slightly increased to 75 mA, whereas stability of the oscillation wavelength and basic operation characteristics such as light output characteristics were excellent. In particular, a maximum light output level was as high as 50 mW or more, and was very stable without decrease even if oscillation was continued for a long period of time e.g., 1,000 hours or more. This indicates that undesirable self absorption at the light output end in the conventional laser structure is successively suppressed. More specifically, in the laser structure according to the present invention, a current was forcibly supplied to exceed the maximum light output level. Also in this case, degradation in oscillation performance due to an abrupt increase in threshold value which often occurs in the prior art was not observed at all. In the laser according to the present invention, it is considered that the maximum light output level is simply determined in accordance with saturation of light output caused by heat generation.

A method of manufacturing the device of this embodiment will be described below with reference to FIGS. 5A to 5C. According to this manufacturing method, the InGaAlP NAM structure lasers can be manufactured by a metal organic chemical vapor deposition (MOCVD) process which is presently available and is widely performed.

Figure 5A:
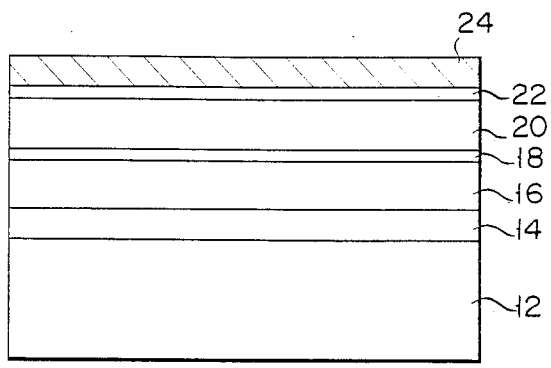
FIGS. 5A to 5C are diagrams showing, in schematic cross-section, some of the major steps in the formation of the laser in accordance with one preferred embodiment of the present invention.

As shown in FIG. 5A, the n-GaAs buffer layer 14 is formed on the gallium arsenide (GaAs) substrate 12 of n-type conductivity. The double-heterostructure section, consisting of the first cladding layer 16 of n-type InGaAlP, the non-doped p-type InGaAlP active layer 18, and the second cladding layer 20 of p-type InGaAlP, is formed on the n-GaAs buffer layer 14. The p-type InGaP cap layer 22 and the n-type GaAs current-blocking layer 24 are sequentially disposed on the double-heterostructure section (the current-blocking layer 24 in FIG. 5A is hatched for the purpose of visual distinction from the remaining layers). The material and formation conditions (thickness, carrier and impurity concentrations, and the like) of these layers are described above, and a detailed description thereof will be omitted. The layers 12 to 24 were formed by the MOCVD method. This step is referred to as "first-step MOCVD process" hereinafter. The InGaAlP layers which constitute the first and second cladding layers 16 and 20 each have a property of varying a band gap energy depending on a crystal growth method and growth conditions while a mol fraction (i.e., composition) in the grown crystal is constant. It is considered, by persons skilled in the art, that this property is caused by a change in atomic alignment in the crystal depending on crystal growth method and growth conditions. In the first-step MOCVD process, a surface temperature of the crystal is set to be 800° C. or less; it was set to be, e.g., 730° C. in this embodiment. Under the condition, the entire active layer 18 had a uniform low-energy band gap. In other words, in this manufacturing step, the entire active layer 18 served as a low-energy band gap region. In practice, a photoluminescence light-emitting wavelength of the active layer 18 at this time was 660 nanometers. Note that a concentration of an impurity, i.e., Zn, doped in the p-type InGaAlP cladding layer (second cladding layer) 20 may fall within the range of $1 \times 10^{17}$ to $5 \times 10^{17}$ atoms per cubic centimeter. If the concentration falls within this range, satisfactorily excellent temperature characteristics required when the semiconductor laser is used in practice can be provided.

Figure 5B:
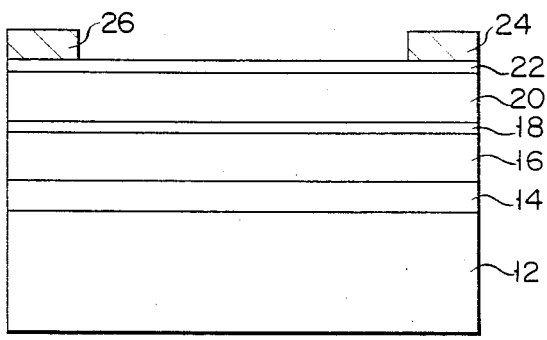

As shown in FIG. 5B, the current-blocking layer 24 was subjected to chemical etching using a photolithography technique and a sulfuric acid-based etchant to form the stripe opening 26 therein. A planar shape of the opening 26 is described above with reference to FIG. 2.

Figure 5C:
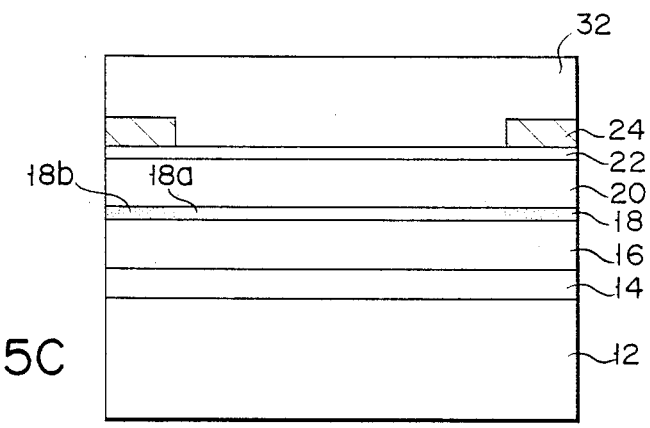

As shown in FIG. 5C, the p-type GaAs ohmic contact layer 32 was crystal-grown on the top surface of the resultant structure by the MOCVD method. It should be noted that this step is to be referred to as a "second-step MOCVD process" hereinafter. At this time, the temperature of a crystal surface is set to be lower than that in the above first-step MOCVD process. In this embodiment, the temperature of the crystal surface in the second-step MOCVD process was kept to be 650° C. With such an MOCVD process, the atomic alignment was changed in only peripheral regions in the InGaP active layer 18 located immediately below the current-blocking layer 24, and the high-energy band gap region 18b was naturally formed. In the remaining central region, i.e., the region immediately below the strip opening 26, in the active layer 18, such a change in atomic alignment did not occur at all. Therefore, the central region still served as the low-energy band gap region 18a. As described above, the region 18b is substantially self-aligned with the stripe opening 26. The high-energy band gap region 18b is dot-illustrated in FIG. 5C for the purpose of visual distinction from the low-energy band gap region 18a. A careful attention must be paid to the fact that no specific additional processes are required to form the high-energy band gap region 18b in the active layer 18, and the region 18b is naturally formed by MOCVD crystal growth of the contact layer 32.

The present inventors have made extensive studies on a physical mechanism which causes such a natural formation phenomenon of the high-energy band gap region 18b. As a result, it is assumed that a change in atomic alignment of InGaP which allows formation of the region 18b is caused by a change in annealing effect of the active layer 18 depending on the presence/absence of the layer component of the GaAs current-blocking layer 24 above the active layer 18. When a photoluminescence light-emitting wavelength in the high-energy band gap region 18b was measured in the device structure obtained in practice in FIG. 5C, the wavelength was 645 nanometers, and a decrease in wavelength by approximately 20 meV was recognized. A NAM structure obtained by forming the high-energy band gap region 18b can be manufactured with excellent reproducibility by appropriately controlling a crystal growth temperature in the second MOCVD process. The temperature control is recommended to be performed such that the first MOCVD crystal growth temperature is set within the range of 730° to 800° C., and the second MOCVD crystal growth temperature is set to be lower than the above set temperature by 50° to 100° C.

After the laser structure shown in FIG. 5C is obtained, a laser beam output end is formed using a well-known conventional technique. For example, after electrode layers are respectively formed on the substrate 12 and the contact layer 24 in the structure shown in FIG. 5C, a cleavage treatment is performed. Therefore, the above structure is treated so that the high-energy band gap region 18b in the active layer 18 serves as an oscillation light output end, thus completing the InGaAlP NAM structure laser device. Note that, according to the laser disclosed in this embodiment, the current-blocking layer 24 also prevents self absorption caused by heat generation due to laser oscillation in the light output end serving as a non-excited region. However, this current-blocking layer 24 does not contribute to realization of the above-mentioned NAM structure. Therefore, when the above function of the current-blocking layer 24 is not particularly required in a given application, the current-blocking layer 24 may be omitted.

Figure 6:
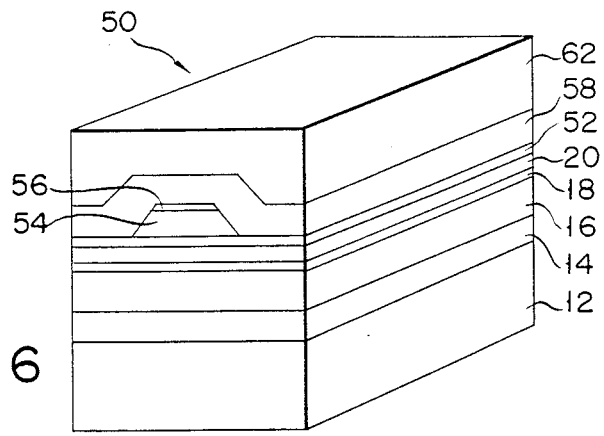
FIG. 6 is a schematic diagram showing the entire arrangement of a high-output InGaAlP laser with a NAM structure according to another embodiment of the present invention.

FIG. 6 perspectively shows the entire structure of an InGaAlP NAM structure laser according to another embodiment of the present invention, which is generally designated by numeral "50". The same parts in the laser 50 of this embodiment are denoted by the same reference numerals as in the laser 10 in the above embodiment, and a repetitive detailed description thereof will be omitted.

A p-type InGaP layer 52 is formed on a second cladding layer 20 which constitutes a double-heterostructure section together with a first cladding layer 16 and an active layer 18. This layer 52 may be typically 0.005 micrometers thick and doped with a p-type impurity such as Zn to a concentration of $1 \times 10^{18}$ atoms per cubic centimeter. This layer 52 serves as an etching stopper. A mesa-stripe cladding layer 54 is formed on the etching stopper layer 52. This layer 54 may be a p-type $In_{0.5}Ga_{0.15}Al_{0.35}P$ layer 54, doped with a p-type impurity such as Zn to a concentration of $4 \times 10^{17}$ atoms per cubic centimeter. The total thickness of layers 20 and 54 is typically 0.8 micrometers. The layer 54 is formed by a crystal growth technique. The layer 54 serves as a part of the underlying second cladding layer 20. A cap layer 56 is disposed on the mesa cladding layer 54. The cap layer 56 may be a p-type $In_{0.5}Ga_{0.5}P$ layer that is approximately 0.05 micrometers thick and doped with a p-type impurity such as Zn to a concentration of $2 \times 10^{18}$ atoms per cubic centimeter. As shown in FIG. 6, these layers 54 and 56 have a stripe-ridge mesa structure.

Figure 7:
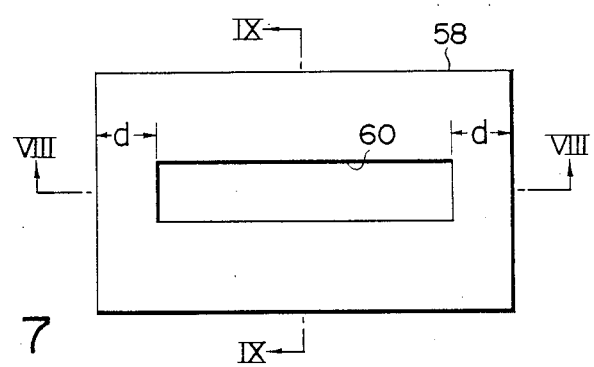
FIG. 7 is a diagram showing a plan view of a current-blocking layer having a stripe opening of the laser shown in FIG. 6.
Figure 8:
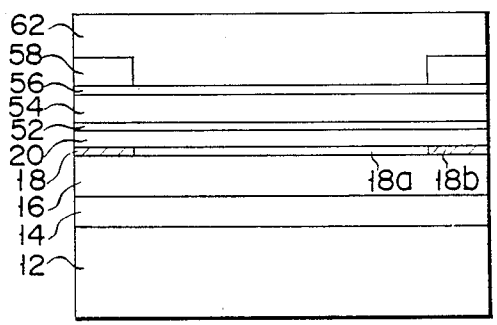
FIG. 8 is a diagram showing a cross-sectional structure taken along the line VIII—VIII of the laser shown in FIG. 6.
Figure 9:
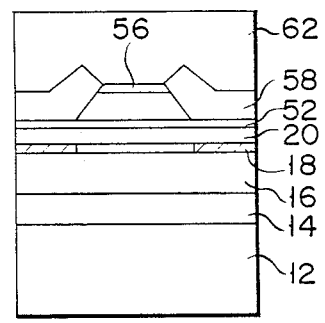
FIG. 9 is a diagram showing a cross-sectional structure taken along the line IX—IX of the laser shown in FIG. 6.

A current-blocking layer 58 is formed to cover the mesa structure sections 54 and 56. The current-blocking layer 58 may be a GaAs layer, typically 0.5 micrometers thick and doped with an n-type impurity such as Si to a concentration of $2 \times 10^{18}$ atoms per cubic centimeter. A planar shape of the current-blocking layer 58 is shown in FIG. 7. The current-blocking layer 58 has a stripe opening 60 in a central region. More specifically, the current-blocking layer 58 is not formed in a region which is spaced apart inward from a laser beam output end of the top surface of the stripe ridge mesa structure consisting of the layers 54 and 56 by a predetermined distance d (=at least 5 micrometers). The current-blocking layer 58 covers only the exposed top surface of the etching stopper layer 52, slanted side surfaces of the stripe ridge mesa structure section, and both end portions (distance d=5 micrometers) of the mesa structure section. With such an arrangement, low-and high-energy band gap regions 18a and 18b are formed in the active layer 18 in the same manner as in the above embodiment, as shown in FIGS. 8 and 9.

An ohmic contact layer 62 (see FIG. 6) is formed on the current-blocking layer 58 to bury the stripe opening 60 in the current-blocking layer 58. The ohmic contact layer 62 may be a p-type GaAs layer, approximately 3 micrometers thick and doped with a p-type impurity such as Zn to a concentration of $3 \times 10^{18}$ atoms per cubic centimeter.

Also in the laser 50, an excellent NAM structure can be realized in the same manner as in the laser 10 in the above embodiment. More specifically, a difference in complex index of refraction occurs between the mesa-stripe cladding layer 54 and the current-blocking layer 58. An oscillated laser beam is confined and guided by a ridge portion of the mesa structure section on the basis of the difference in complex index of refraction. A current blocked by the current-blocking layer 58 is supplied in a portion except for the terminal portions of the mesa structure section. The high-energy band gap region 18b in the active layer 18 is "transparent" with respect to the oscillation light wavelength determined in accordance with a band gap of the low-energy band gap region 18a. The reason for this is the same as in the above embodiment. As a result, undesirable self absorption near the light output ends of the laser 50 could be suppressed or stopped, and degradation in high-output laser oscillation could be eliminated. According to our experiments, high-level transverse mode stabilized laser oscillation having a light output of 50 mW or more could be stably maintained.

Figure 10:
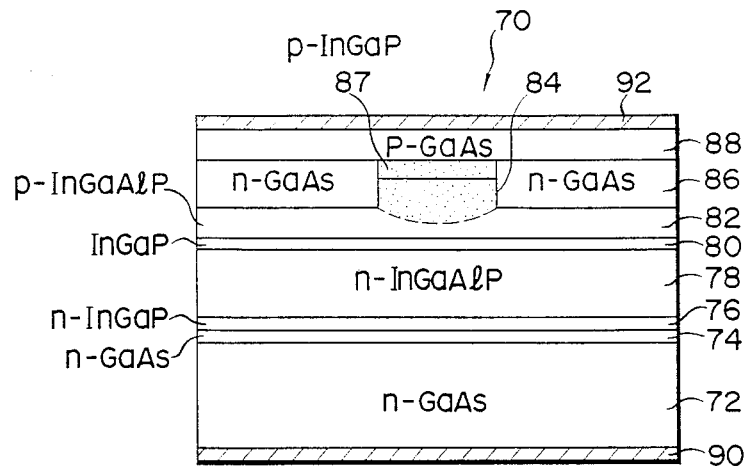
FIG. 10 is a schematic diagram showing the entire arrangement of a high-output InGaAlP laser with a NAM structure according to still another embodiment of the present invention.

FIG. 10 shows an InGaAlP NAM structure laser 70 according to still another embodiment of the present invention, which is generally designated by numeral "70". A semiconductor substrate 72 is a gallium arsenide (GaAs) layer of n-type conductivity. A first buffer layer 74 of n-type conductivity is formed on the n-GaAs substrate 72. The buffer layer 74 is, for example, a GaAs layer that is typically 0.5 micrometers thick and doped with an n-type impurity to a concentration of $8 \times 10^{17}$ atoms per cubic centimeter. A second buffer layer 76 of n-type conductivity is formed on the first buffer layer 74. The buffer layer 76 may also be a $In_{0.5}Ga_{0.5}P$ layer that is typically 0.5 micrometers thick and doped with an n-type impurity to a concentration of $8 \times 10^{17}$ atoms per cubic centimeter.

A double-heterostructure section is disposed on a surface of the second buffer layer 76. The double-heterostructure section consists of a first cladding layer 78, an active layer 80, and a second cladding layer 82. The first cladding layer 78 may be an n-type $In_{0.5}Ga_{0.15}Al_{0.35}P$ layer having a thickness of approximately 0.8 micrometers, doped with an n-type impurity such as Si to a concentration of $4 \times 10^{17}$ atoms per cubic Centimeter. The active layer 80 may be a nondoped $In_{0.5}Ga_{0.5}P$ layer of p-type conductivity, typically 0.06 micrometers thick. In principle, a carrier concentration of the active layer 80 is set to be $1 \times 10^{17}$ per cubic centimeter or less. The active layer 80 may be of an n- or p-type. The second cladding layer 82 may be a p-type $In_{0.5}Ga_{0.15}Al_{0.35}P$ layer having a thickness of approximately 0.8 micrometers, doped with a p-type impurity such as Zn to a concentration of $4 \times 10^{17}$ atoms per cubic centimeter.

The second cladding layer 82 is formed with a projecting portion (mesa) designated by numeral "84" in FIG. 10 by a known etching treatment. In FIG. 10, a waveguide channel region to which a current is mainly supplied in an oscillation mode of the laser 70 is dot-ilustrated for the purpose of visual distinction. A p-type cap layer 87 is formed on the top surface of the mesa section 84. The cap layer 87 may be an $In_{0.5}Ga_{0.5}P$ layer that is doped with a p-type impurity such as Zn to a concentration of $2 \times 10^{18}$ atoms per cubic centimeter. An n-type GaAs current-blocking layer 86 is formed to bury side surfaces of the etched portion, i.e., the mesa section 84, in the second cladding layer 82. A composition and formation conditions of the layer 86 may be the same as those in the laser 50 in the above embodiment. The top surface of the mesa section 84 is even with that of the current-blocking layer 86, as shown in FIG. 10. A p-type contact layer 88 is stacked on the layers 84 and 86. A composition and formation conditions of the layer 88 are the same as those of the laser 50 in the above embodiment. Metal layers 90 and 92 are formed on the substrate 72 and the contact layer 88, respectively. The metal layers 90 and 92 serve as p-type n-type electrodes, respectively.

Figure 11A:
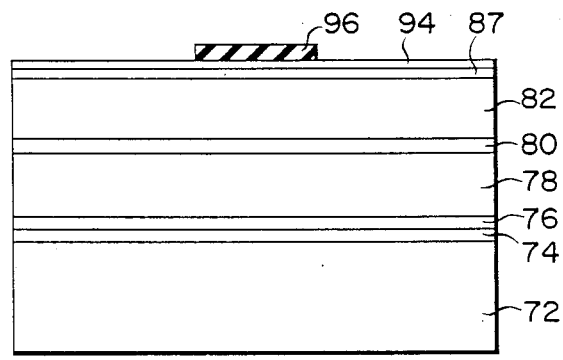
FIGS. 11A through 11D are diagrams showing, in schematic cross-section, some of the major steps in the formation of the laser shown in FIG. 10 in accordance with the present invention.

The above-mentioned laser structure 70 is manufactured as follows. As shown in FIG. 11A, the layers 74, 76, 78, 80, 82, and 87 are sequentially formed on the substrate 72 by MOCVD crystal growth. Thereafter, a p-type $In_{0.5}Ga_{0.15}Al_{0.35}P$ layer 94 is disposed on the cap layer 87 by MOCVD crystal growth. The layer 94 serves as a damage-proof layer which has a great effect in the following etching step. Then, an $SiO_2$ masking layer 96 is deposited on the damage-proof layer 94. The masking layer 96 has a stripe shape corresponding to a planar shape of the above-mentioned mesa section 84.

Figure 11B:
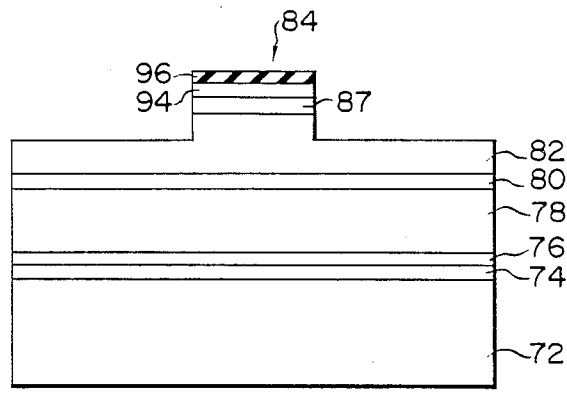

Subsequently, selective etching is performed using the masking layer 96. The etching is performed halfway through the second cladding layer 82 (the second cladding layer 82 is selectively etched), thereby forming the mesa section 84, as shown in FIG. 11B. The mesa section 84 includes the perfectly etched cap and damage-proof layers 87 and 94. During the etching step, the damage-proof layer 94 functions to reduce etching damages of the underlying layers 87 and 82. A solution mixture of a hydrogen bromide-based etching solution and hot sulfuric acid was used as an etchant.

Figure 11C:
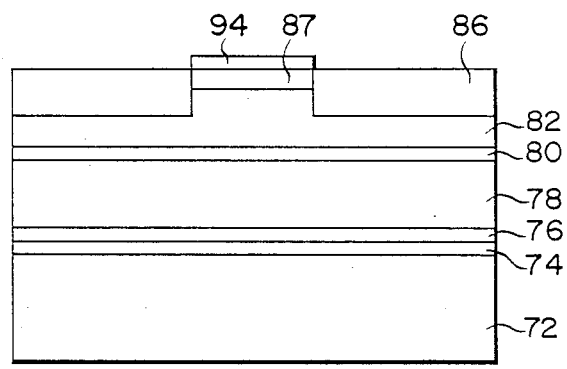

Thereafter, using the masking layer 96 again, the current-blocking layer 86 is formed on both side surfaces of the partially etched second cladding layer 82 and mesa section 84 by selective crystal growth using a reduced-pressure MOCVD method, as shown in FIG. 11C. Prior to growth of the current-blocking layer 86, the masking layer 96 is subjected to partial etching, and the end portions are removed. Therefore, the masking layer 96 is treated to have an identical planar shape to those of the stripe openings 26 and 60 respectively shown in FIGS. 2 and 7. Therefore, the current-blocking layer 86 thus formed has an identical rectangular shape to that in the case shown in FIG. 2 or 7. After the current-blocking layer 86 is formed, the masking layer 96 was removed by, e.g., hydrogen fluoride. Then, the damage-proof layer 94 which remained on the mesa section 84 was removed by hot sulfuric acid.

Figure 11D:
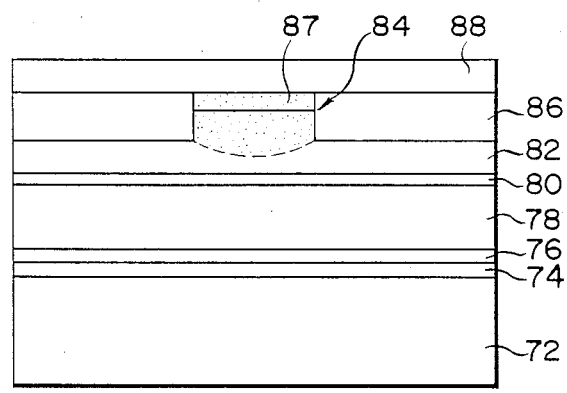

Subsequently, as shown in FIG. 11D, the contact layer 88 is formed on the mesa section 84 and the current-blocking layer 86 by MOCVD crystal growth. Prior to growth of the layer 88, hydrogen selenide ($H_2Se$), dimethylzinc (DMZ), or diethylzinc (DEZ) was flown together with phosphine ($PH_3$) at a crystal growth temperature (700° C.) for a predetermined time period, e.g., three minutes. When the additional electrodes 90 and 92 are formed in the resultant structure shown in FIG. 11D by a known method, the InGaAlP laser is completed.

In the device 70 according to the third embodiment, in the same manner as in the above embodiments, an oscillation laser beam output end in the InGaP active layer 80 serves as a high-energy band gap region, thus providing an excellent NAM structure. In addition, according to this embodiment, the use of the InGaAlP layer as the damage-proof layer 94 can allow the crystal growth process in a phosphine atmosphere to form the layers 78, 80, 82, 86, 87, and 88 which are grown on the second buffer layer 76. This suggests a possibility of drastic reduction in time period required for the crystal growth process of the InGaAlP NAM structure lasers in the present invention.

In addition, according to this embodiment, in the step of removing the $SiO_2$ layer 96 and the damage-proof layer 94 which is performed prior to forming the contact layer 88, hot sulfuric acid was selected as an etchant. Therefore, even if these layers 94 and 96 were carefully removed for a time period longer than that in a normal treatment, accidents wherein the underlying current-blocking layer 86 is undesirably etched or subjected to an etching damage did not occur at all. As a result, the thickness of the obtained current-blocking layer 86 could be increased up to a desired value, and excellent current-blocking characteristics could be obtained. The present inventors have examined a cause and effect relationship (correlation) between the thickness of the damage-proof layer 94, a damage which occurs in practice, and a lateral etching amount upon formation of the mesa section 84. As a result, the following relationships became apparent. If the thickness of the InGaAlP damage-proof layer 94 was set to be 0.1 micrometer or less, the damage of the resultant current-blocking layer 82 was noticeable. If the thickness of the layer 94 was set to be 0.5 micrometers or more, a lateral etching amount upon formation of the mesa section 84 was increased. Therefore, the thickness of the damage-proof layer must be selected within the range of 0.1 to 0.5 micrometers.

FIG. 12 shows the entire structure of an InGaAlP NAM structure layer according to the fourth embodiment of the present invention, which is generally designated by numeral "100". The laser 100 includes an n-type GaAs substrate 102. A first cladding layer 104 of an n-type $In0.5(Ga_{1-x}Al_x)_{0.5}P$ layer, a non-doped InGaP active layer 106, and a second cladding layer 108 of a p-type $In_{0.5}(Ga_{1-x}Al_x)_{0.5}P$ layer are sequentially formed on the substrate 102 to constitute a double-heterostructure section. A p-type InGap cap layer 110 is formed on the second cladding layer 108. An n-type GaAs current-blocking layer 112 and a p-type GaAs contact layer 114 are formed on the top surface of the cap layer 110. N-and p-side electrode layers 116 and 118 are formed on the substrate 102 and the contact layer 114, respectively. In FIG. 12, the width (i.e., the waveguide channel width) of the stripe opening in the current-blocking layer 112 is denoted by reference symbol "Ws", and was set to be 7 micrometers in this embodiment. A length of the substrate 102 along the above channel width is denoted by reference symbol "Ls", and was selected to be 300 micrometers. Although not visible in FIG. 12, a resonance cavity length L of the laser 100 was set to be, e.g., 300 micrometers. The thickness of each of the first and second cladding layers 104 and 108 is denoted by reference symbol "h", and was set to be 0.8 micrometers. The thickness of the active layer 106 is denoted by reference symbol "a", and was set to be, e.g., 0.06 micrometers.

The values of the lengths Ls and Ws in the laser 100 are selected in consideration of the following. The value Ls must be at least four times the value Ws for the following reason. A measurement result of change characteristics of a temperature increase T of the active layer 110 as a function of the value Ls in a continuous oscillation mode of the laser 100 is shown in the graph in FIG. 13. The temperature increase $\Delta T$ is obtained by repeating simulation calculation while the value Ls is varied using a thermal conduction model. As is apparent from the graph in FIG. 13, the temperature increased $\Delta T$ is varied depending on the substrate length Ls with a consistent tendency. The temperature increase $\Delta T$ must be minimized. If a target value of the temperature increase $\Delta T$ is 10 degrees, and measurement values of the substrate length Ls with respect to the channel width Ws are plotted, the graph in FIG. 14 showing correlation characteristics can be obtained. Assume that, in FIG. 14, a solid curve represents actual characteristics, and that a broken line is a basic line representing "Ls=4.Ws". When a region in which $\Delta T \leq 10$ is extracted from the graph in FIG. 14, the length Ls is always four times or more the channel width Ws. On the basis of the consideration based on the above fact, in the laser 100 of this embodiment, when the channel width Ws was set to be 7 micrometers, the substrate length Ls was selected to be 300 micrometers.

Although the invention has been described with reference to specific embodiments, it shall be understood by those skilled in the art that numerous modifications may be made that are within the spirit and scope of the invention.

In the above embodiments, the internal current-blocking structure laser and the transverse mode stabilized structure laser having a light guide structure of a stripe ridge cladding layer are exemplified. However, a semiconductor laser having a similar structure near a light output end can achieve laser characteristics which are not degraded up to a high output, as a matter of course. The cause of a difference in band gap energy, which in turn is caused by a difference in atomic alignment depending on a crystal growth method and growth conditions, is considered as follows. The atomic distances between In, Ga, and Al (Group III) and P (Group V) are different from each other. The atoms are aligned not randomly on the Group III lattice points but regularly in accordance with the crystal growth process, thus setting a stable state with low free energy. Therefore, it is considered that such a phenomenon may occur in not only InGaAlP, but also a general mixed crystal (e.g., InGaAsP, InGaAlAs, or ZnSSe) of compound semiconductors having different lattice constants. For example, the above embodiments can be applied to an active layer having a super-lattice structure of GaAs or AlGaAs. Therefore, the above embodiments can be applied to a semiconductor laser using the above compound semiconductor mixed crystal except for InGaAlP. Various changes and modifications may be made without departing from the spirit and scope of the present invention.

What is claimed is:

1. A method of manufacturing a semiconductor laser, comprising the steps of:
    forming a double-heterostructure section of indium, gallium, aluminum, and phosphorus above a semiconductor substrate by a first metal organic chemical vapor deposition process, said double-heterostructure section including first and second cladding layers and an active layer sandwiched therebetween;
    forming a first semiconductor layer on said double-heterostructure section;
    selectively etching said semiconductor layer to form a stripe opening in said semiconductor layer; and
    forming a second semiconductor layer on said first semiconductor layer to cover said opening by a second metal organic chemical vapor deposition process, whereby a band gap energy of said active layer is reduced in a first region located immediately below said opening, and a band gap energy of a second region except for said first region is increased to be higher than the band gap energy of said first region, said second region including a peripheral end corresponding to a light output end portion of said laser, so that self absorption of a laser beam at said light output end portion in an oscillation mode of said laser is suppressed.

2. The method according to claim 1, wherein a crystal growth temperature in the second metal organic chemical vapor deposition process is lower than that in the first metal organic chemical vapor deposition process.

3. The method according to claim 2, wherein said first semiconductor layer comprises gallium arsenide.

4. The method according to claim 3, wherein said first and second semiconductor layers serve as current-blocking and contact layers, respectively.

5. The method according to claim 4, wherein said second cladding layer is subjected to selective etching prior to formation of said first semiconductor layer, thus forming a stripe projection layer.

6. The method according to claim 5, wherein said first semiconductor layer covers both side surfaces and both peripheral ends of said projecting layer.

7. The method according to claim 6, wherein said active layer comprises indium, gallium, and phosphorus.

8. A method for manufacturing a semiconductor laser comprising the steps of:
    forming a first cladding layer above a semiconductive substrate;
    forming an active layer on said first cladding layer;
    forming a second cladding layer on said active layer, said second cladding layer including a waveguide channel region to which a current is mainly supplied in an oscillation mode of said laser, and an output end from which an oscillated laser light is externally output;
    forming, on said second cladding layer, a current-blocking layer having an opening defined above a central region of said waveguide channel region, for covering said output end of said second cladding layer; and
    defining a specific energy band gap region in said active layer at a peripheral portion adjacent to said output end of said second cladding layer, said region including a first energy band gap larger than a second energy band gap in a substantially central region of said active layer, thereby to prevent or suppress self absorption of the oscillated laser light at said output end of said second cladding layer.

9. The method according to claim 8, wherein said active layer comprises indium, gallium, and phosphorus.

10. The method according to claim 9 wherein said first and second cladding layers comprise indium, gallium, aluminum, and phosphorus.

11. The method according to claim 10, wherein an elongated projecting layer serving as said waveguide channel region is formed in said second cladding layer.

12. The method according to claim 11, wherein said opening of said current-blocking layer is formed so as to be elongated and correspond to said projecting layer.

13. The method according to claim 10, wherein said waveguide channel has a selected width, and a length of said substrate in a direction perpendicular to said channel region is at least four times said selected width of said waveguide channel.

* * * * *